United States Patent [19]

Hsu et al.

[11] Patent Number: 5,091,324
[45] Date of Patent: Feb. 25, 1992

[54] PROCESS FOR PRODUCING OPTIMUM INTRINSIC, LONG CHANNEL, AND SHORT CHANNEL MOS DEVICES IN VLSI STRUCTURES

[75] Inventors: James J. Hsu, Saratoga; Yowjuang W. Liu, San Jose, both of Calif.

[73] Assignee: Advanced Micro Devices, Inc., Sunnyvale, Calif.

[21] Appl. No.: 565,384

[22] Filed: Aug. 10, 1990

[51] Int. Cl.[5] .......................................... H01L 21/265
[52] U.S. Cl. ........................................ 437/34; 437/45; 437/56; 437/57; 437/29; 148/DIG. 82
[58] Field of Search ................. 437/34, 45, 56, 57, 437/29; 148/DIG. 23, DIG. 82, DIG. 85

[56] References Cited

U.S. PATENT DOCUMENTS

| | | | |
|---|---|---|---|
| 4,435,895 | 3/1984 | Parrillo et al. | 437/34 |
| 4,530,150 | 7/1985 | Shirato | 437/34 |
| 4,845,047 | 7/1989 | Holloway et al. | 437/45 |
| 4,889,825 | 12/1989 | Parrillo | 437/57 |
| 4,943,537 | 7/1990 | Harrington, III | 437/57 |
| 5,024,961 | 6/1991 | Lee et al. | 437/34 |

FOREIGN PATENT DOCUMENTS

| | | | |
|---|---|---|---|
| 0144841 | 7/1986 | Japan | 437/29 |
| 0067911 | 3/1989 | Japan | 437/29 |

Primary Examiner—Brian E. Hearn
Assistant Examiner—Tuan Nguyen
Attorney, Agent, or Firm—John P. Taylor

[57] ABSTRACT

Highly doped short channel NMOS devices with punch-through protection; intrinsic NMOS devices with low threshold voltage; and long channel NMOS and PMOS devices with low body factor; are constructed by providing one or more lightly doped P regions in a semiconductor wafer in which intrinsic and long channel NMOS devices may be constructed, and one or more N wells in the wafer where PMOS devices can be constructed; forming isolation oxide on the wafer before implanting the wafer to inhibit field inversion in N channel (NMOS) devices; masking N regions of the wafer except where long channel PMOS devices will be formed and portions of P regions of the wafer where long channel NMOS devices will be constructed, and optionally masking P regions where either intrinsic NMOS devices or short channel NMOS devices will be formed; and then implanting the wafer to simultaneously provide a field implant below the isolation oxide, adjacent regions where NMOS devices will be formed, as well as optionally providing a deep implant in P regions where short channel NMOS devices will be constructed to provide punchthrough protection, and optionally providing a deep implant in P regions where intrinsic NMOS devices will be constructed to raise the threshold voltage of such intrinsic devices; then masking P regions of the wafer where intrinsic NMOS devices will be constructed; and implanting the wafer to provide a $V_T$ adjustment to optimize threshold voltages of long channel and short channel NMOS and PMOS devices.

20 Claims, 2 Drawing Sheets

PROCESS FOR PRODUCING OPTIMUM INTRINSIC, LONG CHANNEL, AND SHORT CHANNEL MOS DEVICES IN VLSI STRUCTURES

BACKGROUND OF THE INVENTION

1. Field of the Invention

This invention relates to an improved process for forming MOS devices in a VLSI structure on a semiconductor wafer. More particularly, this invention relates to an improved process for producing optimized intrinsic, long channel, and short channel NMOS devices, as well as PMOS devices, in a VLSI structure on a semiconductor wafer without additional steps and masks.

2. Description of the Related Art

In the construction of MOS devices in VLSI structures, it is necessary to highly dope the channels of the short channel NMOS devices to prevent punchthrough due to the device scaling used in VLSI technology. At the same time, however, it is desirable to also form intrinsic NMOS devices with low threshold voltages in the VLSI structure for use, for example, as pass gates to minimize voltage drops. It is also desirable to form either intrinsic NMOS or long channel NMOS and PMOS devices with low body factor. Body factor is a term used to describe the characteristic of individual MOS devices in series with one another to exhibit a rise in individual threshold voltages. Low body factor results in lower individual threshold voltages exhibited by such devices in series resulting in optimum speed of the devices.

Since punchthrough has to be controlled for short channel devices, prior art processes used for the simultaneous construction of intrinsic, long channel, and short channel NMOS devices are conventionally optimized to provide highly doped short channel NMOS devices for punchthrough protection which results in compromising the long channel and intrinsic NMOS devices with respect to higher threshold voltage, and compromising the long channel NMOS devices with respect to higher body factor. The alternate prior art practice has been to introduce additional steps and masks into the process to protect those areas of the semiconductor wafer where intrinsic and long channel NMOS devices and PMOS devices will be constructed and optimized separately, during doping of the wafer to form the heavily doped short channel NMOS regions. This can increase the manufacturing costs.

It would, therefore, be highly desirable to have a process wherein punchthrough protection for short channel NMOS devices, low threshold voltage for intrinsic NMOS devices, and low body factor for long channel NMOS and PMOS devices could all be achieved without adding additional steps or masks to the process of forming such devices.

SUMMARY OF THE INVENTION

It is, therefore, an object of this invention to provide an improved process for making MOS devices in VLSI integrated circuit structures on semiconductor wafers comprising highly doped short channel NMOS devices with punchthrough protection; intrinsic NMOS devices with low threshold voltage; and long channel NMOS and PMOS devices with low body factor.

It is another object of this invention to provide an improved process for making MOS devices in VLSI integrated circuit structures on semiconductor wafers comprising highly doped short channel NMOS devices with punchthrough protection, intrinsic NMOS devices with low threshold voltages, and long channel NMOS and PMOS devices with low body factor, by first providing one or more lightly doped P regions in a semiconductor wafer in which NMOS devices may be constructed, and one or more N wells in the wafer where PMOS devices can be constructed; forming isolation oxide on the wafer before implanting the wafer to inhibit field inversion in N channel (NMOS) devices; masking N regions of the wafer except where long channel PMOS devices will be constructed, portions of the P regions of the wafer where long channel NMOS devices will be constructed, and optionally portions of the P regions of the wafer where intrinsic NMOS devices will be constructed; and then subsequently implanting the wafer, with a single implantation step, to simultaneously provide a field implant below the isolation oxide, adjacent regions where NMOS devices will be constructed, as well as providing a deep implant in P regions where short channel NMOS devices will be constructed to provide punchthrough protection, and moreover providing a counter doped implant in N regions where long channel PMOS devices will be constructed to provide low N-type background concentration.

It is yet another object of this invention to provide an improved process for making MOS devices in VLSI integrated circuit structures on semiconductor wafers comprising highly doped short channel NMOS devices with punchthrough protection; intrinsic NMOS devices with low threshold voltages; and long channel NMOS and PMOS devices with low body factor; by first providing one or more lightly doped P regions in a semiconductor wafer in which NMOS devices may be constructed, and one or more N wells in the wafer where PMOS devices can be constructed; forming isolation oxide on the wafer before implanting the wafer to inhibit field inversion in N channel (NMOS) devices; masking N regions of the wafer except where long channel PMOS devices will be constructed, masking those portions of the P regions of the wafer where long channel NMOS devices will be constructed, and optionally masking off P regions where either intrinsic NMOS devices or short channel NMOS devices will be formed; and then implanting the wafer to simultaneously provide a field implant below the isolation oxide, adjacent regions where NMOS devices will be formed, as well as optionally providing a deep implant in P regions where short channel NMOS devices will be constructed to provide punchthrough protection, optionally providing a counter doped implant in N regions where long channel PMOS devices will be constructed to provide low N type background concentration, and optionally providing a deep implant in P regions where intrinsic NMOS devices will be constructed to raise the threshold voltage of such intrinsic devices (while optionally masking off such deep implant in P regions where punchthrough NMOS devices will be intentionally constructed); subsequently masking P regions of the wafer where intrinsic NMOS devices will be constructed; and implanting the wafer to provide a threshold ($V_T$) adjustment to optimize the threshold voltages of short channel and long channel NMOS and PMOS devices to be constructed on the wafer.

DETAILED DESCRIPTION OF THE INVENTION

The invention comprises an improved process for the construction of optimized intrinsic, short channel and long channel NMOS devices, as well as PMOS devices, in VLSI structures on a semiconductor wafer such as a silicon wafer without the need for additional steps and additional masks which would further complicate and add to the expense of the process.

By use of the term "intrinsic MOS device" herein is meant an MOS device (usually an NMOS device) in which the channel region has not been provided with a shallow threshold voltage ($V_T$) adjustment implant. The intrinsic MOS device may be either long channel or short channel in geometry.

The term "long channel MOS device" usually refers to an MOS device wherein the channel length is of a sufficient minimum length so that the threshold voltage is independent of the channel length. The term "short channel MOS device", in contrast, refers to an MOS device wherein the channel is sufficiently short that the device exhibits $V_T$ roll-off and punchthrough effects. As used herein, both of the terms "long channel MOS devices" and "short channel MOS devices" will be understood to refer to MOS devices which have been provided with a threshold adjustment implant, in contrast to the above defined "intrinsic MOS device".

As alternatively shown in FIGS. 1A and 1B, the process of the invention may be utilized for construction of VLSI integrated circuit structures where an N well has been formed in a lightly doped P type semiconductor wafer, or for "twin tub" integrated circuit structures comprising a lightly doped P well as well as an N well formed in a semiconductor wafer which, in this case, may be either P type or N type and which, in any case, will be referred to hereinafter as a silicon substrate by way of illustration and not of limitation.

Figure 1A:
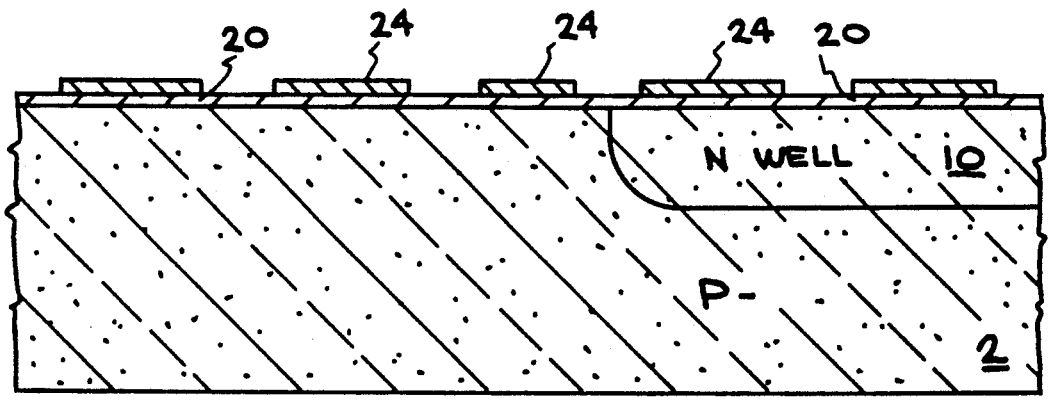
FIG. 1A is a fragmentary side section view of a lightly doped P type semiconductor wafer having an N well formed therein and oxide/nitride isolation oxide masks formed on the surface to permit formation of local isolation oxide in/on the wafer surface.

In the structure shown in FIG. 1A, an N well 10 has been formed in a lightly doped P type silicon substrate 2. N well 10 has a doping concentration of a N type dopant such as phosphorus or arsenic, which may range from about $8 \times 10^{15}$ to about $5 \times 10^{17}$ atoms/cm$^3$, preferably about $5 \times 10^{16}$ atoms/cm$^3$. Phosphorus is the preferred N type dopant, to provide a deep N well ranging in depth from about 1 to about 5 microns.

The P type dopant concentration of silicon wafer or substrate 2 may range from about $6 \times 10^{14}$ to about $4 \times 10^{15}$ atoms/cm$^3$, and preferably ranges from about $6 \times 10^{14}$ to about $2 \times 10^{15}$ atoms/cm$^3$. The P type dopant usually comprises boron, to provide a light P type dopant concentration level in silicon substrate 2 which will be referred to herein as an intrinsically doped substrate with respect to formation of an intrinsic NMOS device therein without further doping of its channel region.

Still referring to FIG. 1A, a mask is shown formed over the regions of substrate 2 where the MOS devices will be formed to permit formation of isolation oxide between such MOS devices. The mask shown in FIG. 1A comprises a nitride mask layer 24 formed over a first oxide layer 20. Nitride mask layer 24 may be formed directly over substrate 2, but it is preferable to form an intermediate oxide layer 20 between nitride mask layer 24 and silicon substrate 2. In FIGS. 1A and 1B, oxide layer 20 is not shown as patterned. However, it will be understood that when the isolation oxide is formed in slots or trenches in silicon substrate 2 (rather than grown as field oxide as shown in FIG. 2), oxide layer 20 will also be patterned in the same configuration as nitride mask layer 24.

Figure 1B:
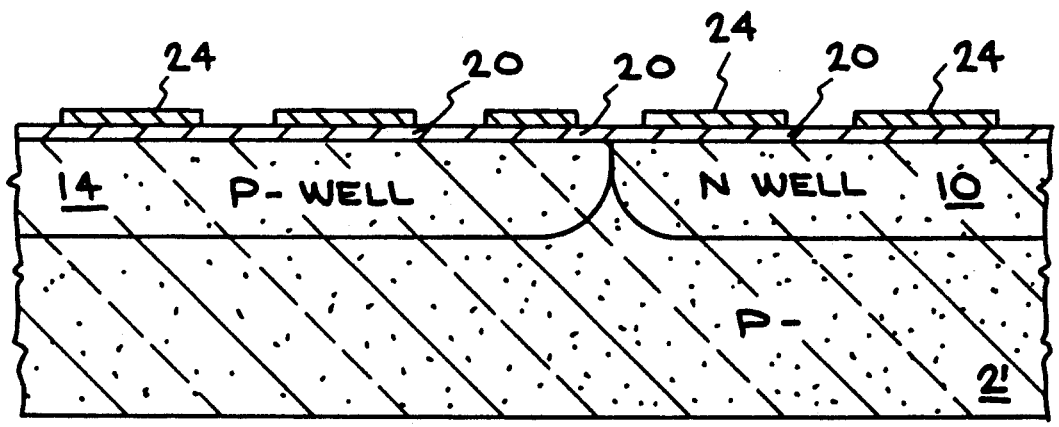
FIG. 1B is a fragmentary side section view of a P type semiconductor wafer having an N well and a P well formed therein and oxide/nitride isolation oxide masks formed on the surface to permit formation of local isolation oxide in/on the wafer surface.
Figure 2:
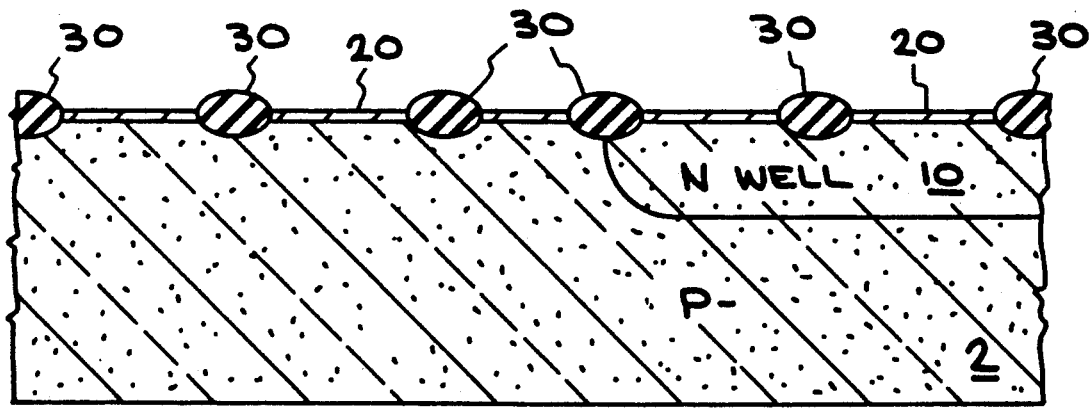
FIG. 2 is a fragmentary side section view showing local field oxide grown on the semiconductor wafer of FIG. 1A prior to the field implant step.

FIG. 1B shows an alternate construction which can be used in the improved process of the invention wherein a P well 14 is also formed in silicon substrate 2'. P well 14 is doped to provide a lightly doped P type dopant concentration which also may range from about $6 \times 10^{14}$ to about $4 \times 10^{15}$ atoms/cm$^3$, but preferably will range from about $2 \times 10^{15}$ to about $4 \times 10^{15}$ atoms/cm$^3$, of a P type dopant such as boron. This type structure, sometimes referred to as a "twin tub" structure, because of the presence of both N wells and P wells, is preferred by some because of the greater control of the dopant concentration of both the N type dopant in the N wells used to construct PMOS devices and the P type dopant in the P wells used to construct the NMOS devices. It also permits optimization, for example, of the P type dopant concentration in the P well for long channel NMOS devices without adversely affecting the intrinsic NMOS devices because of the relatively low level of P type doping of the lightly doped P well.

When the background dopant level of the silicon wafer is used, as in the structure of FIG. 1A, to provide the dopant concentration of the wafer when only a single well is used, for example, an N well, the initial dopant level supplied by the silicon ingot producer must be relied upon to supply the correct dopant level for the active devices constructed therein, i.e., outside of the well, for example, the concentration of P type dopant.

In view of this, the use of both N wells and P wells in a silicon wafer is preferred since this permits more accurate control of dopant levels in both the N wells and the P wells. However, for simplicity, the remainder of the process will be illustrated with respect to a silicon wafer having only one type of well, an N well formed in a lightly doped P type silicon wafer, it being understood that the process has equal application in either such a structure or in silicon wafers having both N wells and P wells where the doping concentration of the P wells, such as shown in FIG. 1B, approximates the dopant level of the P type substrate in FIG. 1A, i.e., sufficiently light to permit construction of NMOS transistors therein referred to as intrinsic MOS devices.

Referring now to FIG. 2, the isolation field oxide to be formed in between the MOS devices to be constructed in and on silicon substrate 2 may be formed by etching slots or grooves in substrate 2, followed by filling of such slots or grooves with oxide. Alternatively, as shown in FIG. 2, isolation field oxide 30 is grown in and on the surface of silicon substrate 2 by, for example, exposing the unmasked silicon surfaces of substrate 2 to dry oxygen or steam to form a field oxide having a thickness which may range from about 3000 to about 6000 Angstroms.

While the forming of such isolation oxide, as shown in FIG. 2, as a part of the improved process of the invention, is not new per se, it must be pointed out that, in accordance with the invention, this oxide formation step is carried out before the field implant step. Conventionally, the silicon substrate is doped first, that is prior to growth of the field oxide, to provide a field oxide implant in the substrate regions where the oxide will be grown, adjacent one or more NMOS devices to provide an implant of P type dopant beneath the field oxide. This field oxide implant doping prevents the phenomena of field inversion which can otherwise occur in the substrate beneath the isolation oxide adjacent the source and drain regions of NMOS devices.

Figure 3:
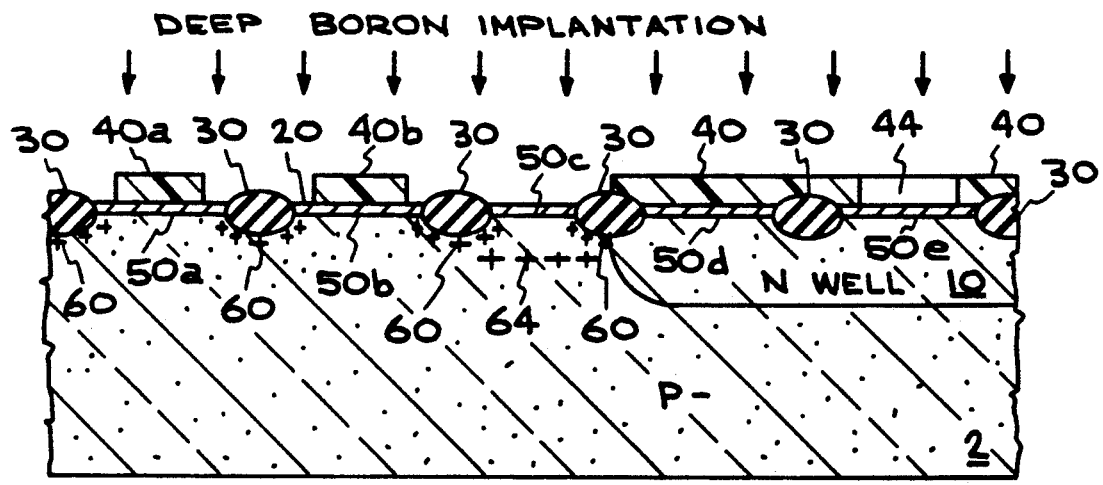
FIG. 3 is a fragmentary side section view showing the masked semiconductor wafer being doped to simultaneously provide the field implant beneath field oxide in the P regions while also providing deep implantation of the short channel NMOS regions to provide protection from punchthrough, as well as providing counter doped implantation of the long channel PMOS regions to provide low N type background concentration.
Figure 4:
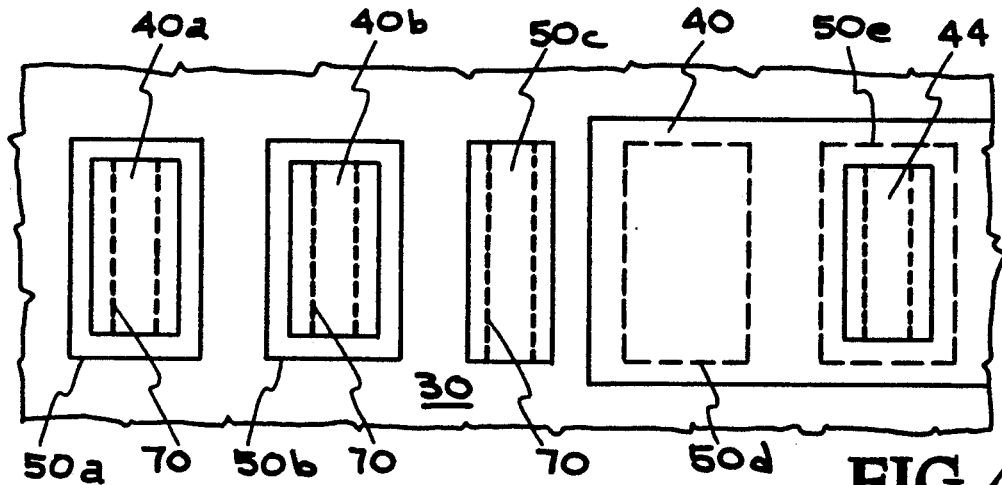
FIG. 4 is a fragmentary top view of the structure shown in FIG. 3 showing the positions of the mask, respectively, over P regions and N regions of the wafer.

After the formation of isolation field oxide 30 shown in FIG. 2, the structure is selectively masked with a material such as a photoresist mask 40. Photoresist mask 40, as shown in FIGS. 3 and 4, covers those regions of N well 10, which consists of active regions 50d (i.e., where PMOS short channel devices will be formed), as well as those field oxide regions 30 over N well 10. Active regions 50e in N well 10, where long channel devices will be formed, are opened for implantation through opening 44 in mask 40. Mask portions 40a and 40b of mask 40 cover portions of active regions 50a and 50b in substrate 2, not covered by oxide 30, where intrinsic and long channel NMOS devices will respectively be formed.

Photoresist mask 40 will be formed to a thickness of at least about 1.5 to about 2 microns to prevent penetration of the selective implantation which is then carried out, as also shown in FIG. 3.

The implantation shown in FIG. 3 comprises a deep boron implantation which is carried out selectively in certain portions of the substrate 2 where NMOS devices will be formed. This implantation is carried out for a three fold purpose.

First of all the implantation is carried out through field oxide 30 adjacent to active regions, e.g. regions 50a–50c, where NMOS devices will be formed to provide a heavy boron concentration, i.e., a P+ dopant concentration beneath the field oxide, as shown at 60 in FIG. 3, to inhibit field inversion in substrate 2 beneath oxide 30 adjacent NMOS devices, i.e., to provide the previously discussed field implant. No separate field implant is, therefore, needed.

Secondly, the implantation is carried out to provide a deep boron implant in region 50c of substrate 2, as shown at 64 in FIG. 3, where a short channel NMOS device will be constructed to thereby optimize the short channel NMOS device with respect to punchthrough protection.

Thirdly, the implantation is carried out to provide a counter doped implant in regions 50e of N well 10 where long channel PMOS devices will be constructed to provide lower N-type background concentration.

Mask 40 then protects the N type portions of substrate 2, i.e., the N well portions (except long channel PMOS active regions 50e), during the deep boron implant to prevent the boron ions from penetrating into substrate 2 in the N type regions. At the same time, mask portions 40a and 40b, respectively formed over P type regions 50a and 50b where an intrinsic NMOS device and a long channel NMOS device will respectively be formed, protect regions 50a and 50b from being implanted with the boron implant which would, otherwise excessively raise the threshold voltages of such devices resulting, in at least the case of the long channel NMOS device, in undesirably high body factor for the resulting long channel transistor.

It should be noted, however, that in some instances the channel region where an intrinsic NMOS device is to be formed may not be masked during the deep boron implantation. This will result in an intrinsic NMOS transistor having a threshold voltage $V_T$ which, for example, when a standard 5 volt power supply is used, will be intermediate between a normal intrinsic NMOS threshold voltage of about 0.1 volts and a normal long channel NMOS threshold voltage of about 0.7 volts. Such a modified intrinsic NMOS device will be useful where such an intermediate threshold voltage is desirable.

Conversely, there may be some applications where it is not desired to provide the deep implant in the channel region of a short channel NMOS device where punchthrough protection is not a desired or necessary attribute of the resulting short channel NMOS transistor, i.e., when the short channel NMOS device is to be used as a depletion device. In such cases, a portion of mask 40 will be formed as well over the active region where such a short channel NMOS device is to be formed.

The deep boron implantation step is carried out at an energy level of from about 100 Kev to about 200 Kev to provide a dopant dosage, in those portions of substrate 2 being implanted, ranging from about $1.2 \times 10^{12}$ to about $5 \times 10^{13}$ boron atoms/cm$^2$ at a depth level ranging from about 0.3 to about 0.5 microns in short channel NMOS region 50c to provide a boron dopant concentration of from about $5 \times 10^{15}$ to about $2 \times 10^{17}$ boron atoms/cm$^3$. The energy level will be sufficient to not only provide the desired implantation depth in short channel NMOS region 50c and long channel PMOS region 50e to respectively provide the above discussed punchthrough protection and the desired background concentration, but will also be sufficient to penetrate through the 3000–6000 Angstrom thick field oxide to provide the desired field inversion protection (field implant) doping just below field oxide portions 30 in the NMOS regions of substrate 2 without, however, penetrating through photoresist mask layer 40, including mask 40a and 40b.

The concentration of N-type dopant, after the counter doping, in active regions 50e of N well 10 where long channel PMOS devices will be constructed, and in particular in the channel regions of such long channel PMOS devices, will range from about $1 \times 10^{15}$ to about $1 \times 10^{17}$ atoms/cm$^3$, and preferably will be about $1 \times 10^{16}$ atoms/cm$^3$.

Still referring to FIGS. 3 and 4, it will be further noted that in accordance with the process of the invention, masks 40a and 40b are deliberately smaller in both length and width than the respective lengths and widths of wafer regions 50a and 50b not covered by field oxides 30. This is to ensure that masks 40a and 40b do not interfere with the field implant doping of the substrate regions beneath field oxide 30 around all sides of the NMOS transistors to be constructed in regions 50a and 50b which provide the field inversion protection which all NMOS devices need, whether intrinsic, long channel, or short channel.

It will also be noted that opening 44 in mask 40 shown in FIGS. 3 and 4 is undersized so that counter doping in the channel region of the long channel PMOS device (i.e., the area between the dotted lines in active region 50e which represents the area which will be occupied by the channel portion of the long channel PMOS device) will not interfere with N well doping adjacent the field oxide portions 30 since the field doping must be at a higher level of N type dopant.

At the same time, it will, however, be noted that the respective widths of masks 40a and 40b is wider than the channels, depicted as dotted lines 70 in FIG. 4, which will eventually be formed beneath the respective gate electrodes to be formed over the central part of regions 50a and 50b of substrate 2.

Thus, by making masks 40a and 40b undersized with respect to the respective length and width of regions 50a and 50b, field implantation under adjacent field oxide 30 is assured; while making masks 40a and 40b oversized with respect to the subsequent channels to be formed for the intrinsic and long channel NMOS transistors to be constructed in regions 50a and 50b, assures low threshold voltage and low body factor for these transistors, i.e., because the channel regions for such transistors are shielded, respectively, by masks 40a and 40b during the deep boron implantation step. Similar results are obtained by the use of undersized mask opening 44 over active regions 50e.

Figure 5:
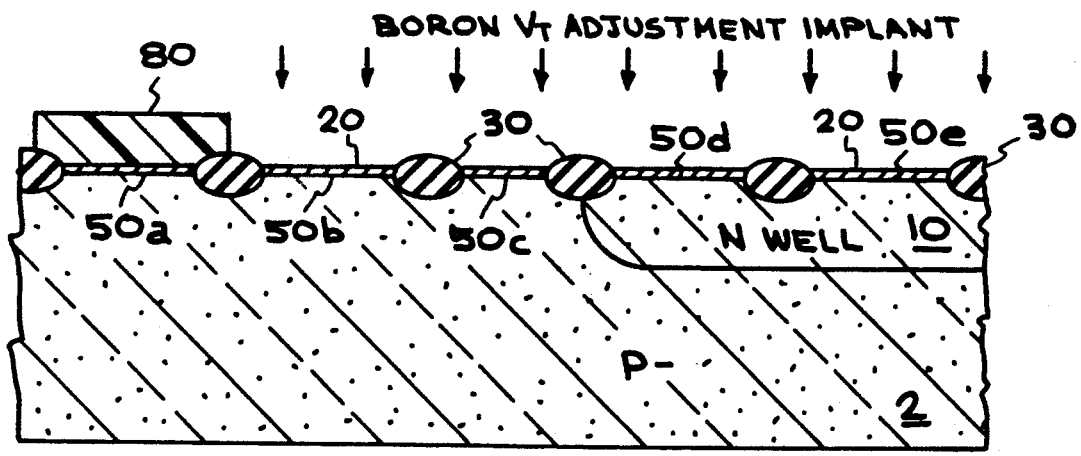
FIG. 5 is a fragmentary side section view showing the step of providing an adjustment implant to optimize the threshold voltage ($V_T$) of long channel and short channel NMOS and PMOS devices after the implantation shown in FIGS. 3 and 4.

Turning now to FIG. 5, yet another aspect of the invention is illustrated wherein the threshold voltage $V_T$ of the long channel MOS devices to be constructed in both the P regions and N regions of the substrate may be optimized, after the deep boron implant step of FIGS. 3 and 4, and either before or after growth of a gate oxide layer in exposed regions of the substrate such as regions 50a-50e, by masking region 50a where NMOS intrinsic transistors will be constructed with a photoresist mask 80 and then doping the unmasked substrate regions, i.e., regions 50b-50e, with a P type dopant such as boron.

This doping step will raise the P type dopant level in the channel regions of the long channel NMOS transistors (and effectively lower the N type concentration in the channel regions of the long channel PMOS devices) to be constructed to raise the threshold voltages, for example in the case of the NMOS long channel devices, from an intrinsic threshold voltage $V_T$ level of from about 0.1 volts up to an adjusted threshold voltage level of from about 0.5 to about 0.9 volts (when a typical 5 volt power supply is used), preferably to a adjusted threshold voltage level about 0.6 volts to about 0.8 volts, and typically about 0.7 volts, which matches with the threshold voltage ($V_T$) of the short channel devices. Correspondingly, the threshold voltages of the PMOS devices are lowered about the same amount, e.g., from $-1.3$ volts before the $V_T$ adjustment doping to an adjusted threshold voltage level of from about $-0.5$ to about $-0.9$ volts, preferably to a adjusted threshold voltage level about $-0.6$ volts to about $-0.8$ volts, and typically an adjusted threshold voltage $V_T$ of $-0.7$ volts. It will, of course, be understood, that such recited adjusted threshold voltages are based on the use of a standard 5 volt power supply and the actual adjusted threshold voltages, when other power supplies are used, will vary—but will be equivalent in such variation to those recited for a 5 volt power supply, i.e., will be larger when a higher voltage power supply is used and lower when a lower voltage power supply is used.

This $V_T$ adjustment doping is accomplished by doping the exposed portions of the substrate, e.g., regions 50b-50e, with a boron dosage of from about $5 \times 10^{11}$ to about $5 \times 10^{12}$ boron atoms/cm$^2$ to provide a surface boron $V_T$ adjustment doping to a depth of not more than about 3000 Angstroms. Since this implant is not a deep implant, an energy level of, for example, from about 15-35 Kev may be used using boron as the dopant source, or, when a boron source such as BF$_2$ is used, an energy level of about 30-60 Kev may be used.

It should also be noted that mask 80 need not comprise an undersized mask such as mask 40a shown in FIGS. 3 and 4 since this implantation is only intended to provide adjustment of the dopant concentration in the channel regions.

Following these implantation steps to respectively optimize the intrinsic, long channel, and short channel MOS devices to be constructed in silicon substrate 2, which constitute the improved process of the invention; the respective MOS devices may be formed thereon by conventional processing. That is, the MOS transistors may then be formed, for example, by the conventional processing steps of cleaning the silicon wafer; oxidizing the cleaned silicon to form gate oxide; depositing, doping, and patterning, a layer of polysilicon to form polysilicon gate electrodes; doping the source and drain regions of the respective transistors; and forming contacts to the respective source and drain regions, as well as to the gate electrode.

As noted above, $V_T$ adjustment implant step may be performed before or after the step of forming the gate oxide over the exposed regions of the substrate in between field oxide where the MOS transistors will be formed. While no annealing steps have been described, it will be understood by those skilled in the art that the subsequent processing steps, such as gate oxidation, polysilicon gate electrode formation, and source and drain formation, will provide sufficient annealing for the deep boron implant and the $V_t$ adjustment implant described above.

Thus, the invention provides a process wherein intrinsic, long channel, and short channel NMOS transistors, as well as PMOS transistors, may be formed which are respectively optimized to provide the desired punchthrough protection needed by short channel NMOS transistors while providing the field doping beneath the field oxide needed for all NMOS devices without compromising the low threshold voltages needed by both intrinsic and long channel MOS devices for low body factor, and without the need for additional masks and additional processing steps which would add to the expense of the process as well as potentially lowering the yield.

Having thus described the invention, what is claimed is:

1. An improved process for forming MOS transistors in a VLSI structure on a semiconductor wafer containing at least one N well area wherein the improvement comprises:
   a) forming isolation oxide regions in the surface of said wafer;
   b) masking:
      1) said at least N well area of the wafer except where channel portions of long channel PMOS devices will be formed; and
      2) areas of the wafer where channel portions of intrinsic NMOS devices and long channel NMOS devices will be formed; and
   c) implanting boron into at least one unmasked region of said wafer at a concentration and depth sufficient to provide punchthrough protection for a short channel NMOS device to be subsequently formed in said unmasked region; and at a sufficient energy to penetrate through unmasked portions of said isolation oxide to provide boron dopant beneath said isolation oxide regions which will inhibit field inversion adjacent NMOS devices subsequently constructed between said isolation oxide regions.

2. The improved process of claim 1 wherein said improvement in the process further comprises the additional step of providing at least portions of said semiconductor wafer with a P type dopant concentration which will permit construction of intrinsic NMOS devices therein without further doping of said wafer.

3. The improved process of claim 2 wherein said step of providing portions of said wafer with a P type doping concentration which will permit construction of intrinsic NMOS devices without further doping comprises providing P type regions in said wafer having a P type dopant concentration ranging from about $6 \times 10^{14}$ to about $4 \times 10^{15}$ atoms/cm$^3$.

4. The improved process of claim 3 wherein said improvement further comprises providing a P type semiconductor wafer having a P type dopant concentration of from about $6 \times 10^{14}$ to about $2 \times 10^{15}$ atoms/cm$^3$ to permit construction of intrinsic NMOS devices therein having a threshold voltage $V_T$ of about 0.1 volts without further doping of said wafer.

5. The improved process of claim 3 wherein said improvement further comprises providing at least one P well in said semiconductor wafer having a P type dopant concentration therein of from about $2 \times 10^{15}$ to about $4 \times 10^{15}$ atoms/cm$^3$ to permit construction of intrinsic NMOS devices in said at least one P well having a threshold voltage $V_T$ of about 0.1 volts without further doping of said wafer.

6. The improved process of claim 2 wherein said step of masking areas of said wafer further comprises masking at least one area where the channel portion of an intrinsic NMOS device will be formed.

7. The improved process of claim 6 wherein said step of masking areas of said wafer between said isolation oxide regions further comprises using an undersized mask to cover P doped regions of said wafer between isolation oxide regions where the channel portions of intrinsic NMOS devices and long channel NMOS devices will be formed to ensure that said mask does not interfere with implantation of said wafer below said isolation oxide regions adjacent said P doped regions to provide said inhibition of field inversion by NMOS devices subsequently formed in such P doped regions.

8. The improved process of claim 7 wherein said step of implanting boron into said unmasked regions of said wafer comprises a deep boron implant at an energy level of from about 100 to about 200 Kev to permit said boron to penetrate through said isolation oxide to dope said wafer beneath said oxide to provide said inhibition of field inversion by said NMOS devices.

9. The improved process of claim 8 wherein said step of implanting said boron into said unmasked regions of said wafer further comprises doping said wafer with a boron dopant dosage of from about $1.2 \times 10^{12}$ to about $5 \times 10^{13}$ boron atoms/cm$^2$ at a depth level of from about 0.3 to about 0.5 microns in unmasked regions of said wafer between said isolation oxide regions where short channel NMOS devices may be formed and in unmasked portions of said N well where long channel PMOS devices will be formed.

10. The process of claim 9 which further includes a threshold voltage $V_T$ adjustment implant after said deep boron implant comprising:
    a) masking P regions of said wafer where intrinsic NMOS devices will be constructed; and
    b) then adjusting the threshold voltage of MOS devices to be constructed in unmasked regions of said wafer by implanting said unmasked regions of said wafer with an amount of P type dopant sufficient to raise the threshold voltage $V_T$ of long channel MOS devices constructed in said doped regions to a range equivalent to from about 0.6 volts to 0.8 volts when a 5 volt power supply is used to match the threshold voltage of short channel devices.

11. The process of claim 9 which further includes a threshold voltage $V_T$ adjustment implant after said deep boron implant comprising:
    a) masking P regions of said wafer where intrinsic NMOS devices will be constructed; and
    b) then adjusting the threshold voltage of MOS devices to be constructed in unmasked regions of said wafer by implanting said unmasked regions of said wafer with a dosage of from about $5 \times 10^{11}$ to about $5 \times 10^{12}$ boron atoms/cm$^2$.

12. The process of claim 11 wherein said threshold voltage $V_T$ adjustment implant provides a boron surface doping implant in said unmasked regions of said substrate to a depth of not more than about 3000 Angstroms.

13. The improved process of claim 2 wherein said step of masking areas of said wafer between said isolation oxide regions further comprises masking at least one area where at least one short channel NMOS device will be formed to permit formation of said short channel NMOS device without punchthrough protection which will function as a depletion device.

14. An improved process for forming MOS transistors in a VLSI structure on a semiconductor wafer wherein the improvement comprises:
    a) providing a semiconductor wafer having at least one P type region having a P type dopant concentration ranging from about $6 \times 10^{14}$ to about $4 \times 10^{15}$ atoms/cm$^3$ which will permit construction of at least one intrinsic NMOS device in said P region without further doping of said wafer, and at least one N well in said wafer;
    b) forming isolation oxide regions in the surface of said wafer;
    c) masking:

1) said at least one N well of the wafer except where channel portions of long channel PMOS devices will be formed; and
2) areas of the wafer where channel portions of intrinsic NMOS devices and long channel NMOS devices will be formed;

d) conducting a deep boron implantation by implanting boron, in a single implantation step, into at least one unmasked region of said wafer at a dosage ranging from about $1.2 \times 10^{12}$ to about $5 \times 10^{13}$ boron atoms/cm$^2$ and to a depth of from about 0.3 to about 0.5 microns to provide punchthrough protection for short channel NMOS devices subsequently formed in said unmasked region; and at an energy level of from about 100 to about 200 Kev to penetrate through unmasked portions of said isolation oxide to provide boron dopant beneath said isolation oxide regions which will inhibit field inversion adjacent NMOS devices subsequently constructed between said isolation oxide regions;

e) removing said masks;

f) masking at least one P region of said wafer where said at least one intrinsic NMOS device will be constructed; and g) then adjusting the threshold voltage of MOS devices to be constructed in unmasked regions of said wafer by implanting said unmasked regions of said wafer with a dosage of from about $5 \times 10^{11}$ to about $5 \times 10^{12}$ boron atoms/cm$^2$ to raise the threshold voltage level of long channel NMOS devices and lower the threshold voltage level of long channel PMOS devices to respectively match short channel NMOS and PMOS devices.

15. The improved process of claim 14 wherein a gate oxide layer is formed on the surface of said wafer between said isolation oxide regions after the step of removing said deep boron implant mask and prior to said step of masking said P regions of said wafer where intrinsic NMOS devices will be constructed to conduct said $V_T$ adjustment implant.

16. The improved process of claim 15 wherein said MOS devices are subsequently formed in said regions of said wafer between said isolation oxide regions by the steps of forming a gate electrode over said gate oxide and forming source and drain regions in said wafer adjacent said gate electrode.

17. The improved process of claim 14 wherein said step of forming said isolation oxide on said wafer prior to said deep boron implantation step further comprises growing from about 3000 to about 6000 Angstroms of said isolation oxide on said surface of said wafer.

18. The improved process of claim 14 wherein said improvement further comprises providing a P type semiconductor wafer having a P type dopant concentration of from about $6 \times 10^{14}$ to about $2 \times 10^{15}$ atoms/cm$^3$ to permit construction of intrinsic NMOS devices therein having a threshold voltage $V_T$ of about 0.1 volts without further doping of said wafer.

19. The improved process of claim 14 wherein said improvement further comprises providing at least one P well in said semiconductor wafer having a P type dopant concentration therein of from about $2 \times 10^{15}$ to about $4 \times 10^{15}$ atoms/cm$^3$ to permit construction of at least one intrinsic NMOS device in said at least one P well having a threshold voltage $V_T$ of about 0.1 volts without further doping of said wafer.

20. An improved process for forming MOS transistors in a VLSI structure on a semiconductor wafer wherein the improvement comprises:

a) providing a semiconductor wafer having at least one P well having a P type dopant concentration ranging from about $2 \times 10^{15}$ to about $4 \times 10^{15}$ atoms/cm$^3$ which will permit construction of at least one intrinsic NMOS device in said P region without further doping of said wafer, and at least one N well in said wafer;

b) growing from about 3000 to about 6000 Angstroms of isolation oxide in the surface of said wafer to form isolation oxide regions;

c) masking:
1) said at least one N well of the wafer except where channel portions of long channel PMOS devices will be formed; and
2) areas of the wafer where channel portions of intrinsic NMOS devices and long channel NMOS devices will be formed;

d) conducting a deep boron implantation by implanting boron, in a single implantation step, into at least one unmasked region of said wafer at a dosage level ranging from about $1.2 \times 10^{12}$ to about $5 \times 10^{13}$ boron atoms/cm$^2$ and to a depth of from about 0.3 to about 0.5 microns to provide punchthrough protection for at least one short channel NMOS device subsequently formed in said unmasked region; and at an energy level of from about 100 to about 200 Kev to penetrate through unmasked portions of said isolation oxide to provide a field implant of boron dopant beneath said isolation oxide regions which will inhibit field inversion adjacent NMOS devices subsequently constructed between said isolation oxide regions;

e) removing said field oxide implant mask;

f) masking P regions of said wafer where intrinsic NMOS devices will be constructed; and g) then adjusting the threshold voltage of long channel MOS devices to be constructed in unmasked regions of said wafer by implanting said unmasked regions of said wafer with a dosage of P type dopant of from about $5 \times 10^{11}$ to about $5 \times 10^{12}$ boron atoms/cm$^2$ to provide a boron surface implant in said unmasked regions of said substrate to a depth of not more than about 3000 Angstroms;

to raise the threshold voltage $V_T$ of long channel NMOS devices constructed in said doped regions to a range equivalent to from about 0.6 volts to 0.8 volts and to lower the threshold voltage $V_T$ of long channel PMOS devices constructed in said doped regions to a range equivalent to from about $-0.6$ volts to $-0.8$ volts when a 5 volt power supply is used.

* * * * *